United States Patent
Liu et al.

(10) Patent No.: US 11,393,886 B2
(45) Date of Patent: Jul. 19, 2022

(54) DISPLAY PANEL AND MANUFACTURING METHOD THEREOF, AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Jun Liu, Beijing (CN); Liangchen Yan, Beijing (CN); Bin Zhou, Beijing (CN); Yongchao Huang, Beijing (CN); Luke Ding, Beijing (CN); Wei Li, Beijing (CN); Biao Luo, Beijing (CN); Xuehai Gui, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/704,706

(22) Filed: Dec. 5, 2019

(65) Prior Publication Data
US 2020/0251545 A1   Aug. 6, 2020

(30) Foreign Application Priority Data
Feb. 1, 2019   (CN) .......................... 201910104185.3

(51) Int. Cl.
*H01L 27/32*   (2006.01)
*H01L 27/12*   (2006.01)

(52) U.S. Cl.
CPC ........ *H01L 27/3258* (2013.01); *H01L 27/322* (2013.01); *H01L 27/3262* (2013.01);
(Continued)

(58) Field of Classification Search
CPC ............. H01L 27/3258; H01L 27/3272; H01L 27/322; H01L 27/3262; H01L 2227/323;
(Continued)

(56) References Cited

U.S. PATENT DOCUMENTS

| 6,692,983 B1 * | 2/2004 | Chen ................. H01L 27/14685 438/70 |
| 7,292,294 B2 * | 11/2007 | Hung ................. G02F 1/133516 349/106 |

(Continued)

FOREIGN PATENT DOCUMENTS

| CN | 1624552 A | 6/2005 |
| CN | 101093851 A | 12/2007 |

(Continued)

OTHER PUBLICATIONS

First Office Action dated Jun. 1, 2020 for application No. CN201910104185.3 with English translation attached.
(Continued)

*Primary Examiner* — Vu A Vu
(74) *Attorney, Agent, or Firm* — Nath, Goldberg & Meyer; Joshua B. Goldberg (57) ABSTRACT

Provided are a display panel and a manufacturing method thereof and a display device. The display panel includes a substrate and pixel units formed on the substrate, wherein, along a thickness direction of the display panel, at least one of the pixel units includes a driving and light filtering structure and a light emitting element formed at a side of the driving and light filtering structure facing away from the substrate, and wherein the driving and light filtering structure includes a driving part and a light filtering part, and the light filtering part is disposed in an accommodating hole penetrating through an insulating layer in the driving part along the thickness direction.

19 Claims, 4 Drawing Sheets

(52) U.S. Cl.
CPC ...... *H01L 27/3272* (2013.01); *H01L 27/1214* (2013.01); *H01L 2227/323* (2013.01)

(58) Field of Classification Search
CPC ........... H01L 27/1214; H01L 29/78648; H01L 29/78633
USPC .......................................................... 257/72
See application file for complete search history.

(56) References Cited

U.S. PATENT DOCUMENTS

| | | | | |
|---|---|---|---|---|
| 7,787,168 | B2* | 8/2010 | Park | G02F 1/133514 |
| | | | | 359/259 |
| 7,804,093 | B2* | 9/2010 | Kim | G02F 1/136227 |
| | | | | 257/59 |
| 9,083,002 | B2* | 7/2015 | Kim | H01L 51/5268 |
| 2014/0151708 | A1* | 6/2014 | Jeon | H01L 29/66969 |
| | | | | 257/72 |
| 2018/0166435 | A1* | 6/2018 | Lee | G02F 1/136204 |

FOREIGN PATENT DOCUMENTS

| | | | |
|---|---|---|---|
| CN | 102981335 | A | 3/2013 |
| CN | 103000661 | A | 3/2013 |
| CN | 104375344 | A | 2/2015 |
| CN | 104965366 | A | 10/2015 |
| CN | 105068343 | A | 11/2015 |
| CN | 107664891 | A | 2/2018 |
| CN | 107665951 | A | 2/2018 |
| CN | 107799570 | A | 3/2018 |
| CN | 107817636 | A | 3/2018 |
| CN | 109148489 | A | 1/2019 |
| CN | 109273498 | A | 1/2019 |
| JP | S63119569 | A | 5/1988 |

OTHER PUBLICATIONS

Second Office Action dated Dec. 16, 2020 corresponding to Chinese application No. 201910104185.3.
Office Action dated Aug. 16, 2021, for application No. CN201910104185.3 with English translation attached.

* cited by examiner

DISPLAY PANEL AND MANUFACTURING METHOD THEREOF, AND DISPLAY DEVICE

CROSS-REFERENCE TO RELATED APPLICATION

The present application claims priority from Chinese patent application No. 201910104185.3, filed on Feb. 1, 2019 in Chinese Intellectual Property Office, the content of which is incorporated herein by reference in their entirety.

TECHNICAL FIELD

The present disclosure relates to a field of display devices, and in particular, to a display panel, a manufacturing method of the display panel, and a display device including the display panel.

BACKGROUND

In order to improve a color display effect of a display panel including a bottom emission type light emitting diode, a color resisting block is generally disposed in a pixel unit of the display panel. Generally, the color resisting block is formed on a passivation layer at the outermost side of a thin film transistor (TFT) after forming the TFT for driving the light emitting diode to emit light. However, the display panel having such color resisting block cannot improve the color display effect as desired.

SUMMARY

An aspect of the present disclosure provides a display panel including a substrate and a pixel unit formed on the substrate, wherein, along a thickness direction of the display panel, the pixel unit includes a driving and light filtering structure and a light emitting element formed at a side of the driving and light filtering structure facing away from the substrate, and wherein the driving and light filtering structure includes a driving part and a light filtering part, and the light filtering part is disposed in an accommodating hole penetrating through an insulating layer in the driving part along the thickness direction.

According to an embodiment of the present disclosure, the driving part includes a TFT, and the light filtering part includes a color resisting block.

According to an embodiment of the present disclosure, the insulating layer includes an interlayer insulating layer, the TFT includes an active layer, a gate insulating layer, a gate electrode, and a source-drain layer sequentially disposed in a direction away from the substrate, and wherein the gate electrode and the source-drain layer are respectively disposed on two sides of the interlayer insulating layer, the source-drain layer includes a source electrode and a drain electrode, the source electrode is connected with the active layer through a source via hole penetrating through the interlayer insulating layer, the drain electrode is connected with the active layer through a drain via hole penetrating through the interlayer insulating layer, and the accommodating hole penetrates through the interlayer insulating layer along the thickness direction.

According to an embodiment of the present disclosure, the driving part further includes a light shielding layer provided between the active layer and the substrate, and an orthographic projection of the active layer on the substrate is located within an orthographic projection of the light shielding layer on the substrate.

According to an embodiment of the present disclosure, the driving part further includes a buffer layer provided on a side of the substrate facing the active layer, a part of the buffer layer is provided between the substrate and the light shielding layer, and the accommodating hole penetrating through the buffer layer.

According to an embodiment of the present disclosure, the driving part further includes an electrostatic discharge line disposed on a same layer as the source-drain layer.

According to an embodiment of the present disclosure, the TFT further includes a passivation layer covering the source-drain layer, the passivation layer extends into the accommodating hole, and the color resisting block is disposed on the passivation layer.

According to an embodiment of the present disclosure, the light filtering part further includes a light shielding flange formed on a side of the color resisting block facing away from the substrate, the light shielding flange is disposed around the accommodating hole and connected to the color resisting block in the accommodating hole, and a material of the light shielding flange is same as a material of the color resisting block connected to the light shielding flange.

According to an embodiment of the present disclosure, the light emitting element includes a first electrode including a transparent conductive material, a light emitting functional layer, and a second electrode, and the first electrode is disposed on the side of the driving and light filtering structure facing away from the substrate.

According to an embodiment of the present disclosure, the display panel further includes a planarization layer between the driving and light filtering structure and the light emitting element, a surface of the planarization layer facing away from the driving and light filtering structure is a flat surface, and the first electrode is disposed on the surface of the planarization layer facing away from the driving and light filtering structure.

According to an embodiment of the present disclosure, the display panel further includes a pixel defining layer covering the first electrode, a pixel opening is formed in the pixel defining layer, at least a part of the light emitting functional layer is disposed in the pixel opening, and an orthographic projection of the pixel opening on the substrate is located within an orthographic projection of the color resisting block on the substrate.

Another aspect of the present disclosure provides a manufacturing method of a display panel including: providing a substrate; forming a driving and light filtering structure comprising a driving part and a light filtering part disposed in an accommodating hole penetrating through an insulating layer in the driving part in a thickness direction of the substrate; and forming a light emitting element constituting a pixel unit together with the driving and light filtering structure.

According to an embodiment of the present disclosure, the insulating layer includes an interlayer insulating layer, and the forming the driving and light filtering structure includes: forming an active layer; forming a gate insulating layer; forming a gate electrode; forming an interlayer insulating material layer; patterning the interlayer insulating material layer to form an interlayer insulating layer having the accommodating hole, a source via hole and a drain via hole; forming a source-drain layer including a source electrode and a drain electrode, wherein the source electrode is connected with the active layer through the source via hole, and the drain electrode is connected with the active layer through the drain via hole; and forming the light filtering part in the accommodating hole.

According to an embodiment of the present disclosure, the forming the driving and light filtering structure further includes, between the forming the source-drain layer and the forming the light filtering part: forming a passivation layer covering the source-drain layer, wherein the passivation layer extends into the accommodating hole, and the light filtering part is formed on the passivation layer.

According to an embodiment of the present disclosure, the forming the light filtering part includes: forming a color resist material layer; and exposing and developing the color resist material layer to form a color resisting block positioned in the accommodating hole and a light shielding flange positioned outside and surrounding the accommodating hole and connected with the color resisting block, wherein the light shielding flange is formed on a side of the color resisting block facing away from the substrate.

According to an embodiment of the present disclosure, the manufacturing method further includes, between the providing the substrate and the forming the active layer: forming a light shielding layer, wherein an orthographic projection of the active layer on the substrate is located within an orthographic projection of the light shielding layer on the substrate.

According to an embodiment of the present disclosure, the manufacturing method further includes, between the forming the light shielding layer and the forming the active layer: forming a buffer layer on the substrate and the light shielding layer, wherein the accommodating hole penetrates through the buffer layer.

According to an embodiment of the present disclosure, the forming the light emitting element includes: forming a first electrode with a transparent conductive material; forming a pixel defining layer including a pixel opening, wherein an orthographic projection of the pixel opening on the substrate is located within an orthographic projection of the color resisting block on the substrate; forming a light emitting functional layer, wherein at least a portion of the light emitting functional layer is located in the pixel opening; and forming a second electrode.

According to an embodiment of the present disclosure, the manufacturing method further includes, between the forming the driving and light filtering structure and the forming the light emitting element: forming a planarization layer, wherein a surface of the planarization layer facing away from the driving and light filtering structure is a flat surface, and the first electrode of the light emitting element is formed on the surface of the planarization layer facing away from the driving and light filtering structure.

Another aspect of the present disclosure provides a display device including the display panel described above.

BRIEF DESCRIPTION OF THE DRAWINGS

The accompanying drawings are included to provide a further understanding of the present disclosure and constitute a part of this specification, and are used to explain the present disclosure together with the following specific embodiments of the present disclosure and not to limit the present disclosure. In the accompanying drawings.

DETAILED DESCRIPTION

The specific embodiments of the present disclosure are described in detail blow in connection with the accompanying drawings. It should be understood that the specific embodiments described herein are merely illustrative of the present disclosure and are not intended to limit the present disclosure.

In a display panel, a color resisting block is generally formed on a passivation layer at the outermost side of a TFT for driving a light emitting element to emit light after the TFT is formed, which results in a high height difference between a surface of the color resisting block facing the light emitting element and a surface of the TFT facing the light emitting element, that is, the color resisting block protrudes from the TFT. In order to obtain a flat surface for better forming an anode of the light emitting element, a thicker planarization layer needs to be applied.

Figure 1:
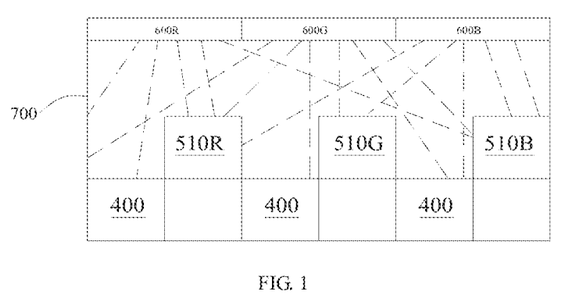
FIG. 1 is a schematic view of light emission of a light emitting element in a display panel.

For example, FIG. 1 is a schematic view of light emission of a light emitting element in a display panel. Three pixel units shown in FIG. 1 are a red pixel unit, a green pixel unit, and a blue pixel unit, respectively. The red pixel unit includes a light emitting element 600R for emitting red light, a driving circuit for driving the light emitting element 600R to emit light, and a red color resisting block 510R. The green pixel unit includes a light emitting element 600G for emitting green light, a driving circuit for driving the light emitting element 600G to emit light, and a green color resisting block 510G. The blue pixel unit includes a light emitting element 600B for emitting blue light, a driving circuit for driving the light emitting element 600B to emit light, and a blue color resisting block 510B.

The driving circuit of each pixel unit includes a TFT 400. It should be noted that the TFT 400 is disposed only in a partial region of each pixel unit, and transparent film layers (e.g., a interlayer insulation layer, a passivation layer, etc.) deposited when forming the TFT 400 are formed in other region of each pixel unit. The color resisting block 510 (including the red color resisting block 510R, the green color resisting block 510G or the blue color resisting block 510B) is disposed on the transparent film layers. It can be seen that there is a considerable height difference between the top surface of the color resisting block 510 (i.e., the surface of the color resisting block 510 facing the light emitting element) and the top surface of the TFT 400 (i.e., the surface of the TFT 400 facing the light emitting element). Accordingly, in order to provide an anode of the light emitting element, a considerably thick planarization layer 700 needs to be provided on the TFT 400 and the color resisting block 510.

The planarization layer 700 is transparent, and after forming a light emitting element on the planarization layer 700, light emitted from the light emitting element will propagate within the planarization layer 700. As shown in FIG. 1, the red light emitted from the light emitting device 600R in the red pixel unit may be propagate to an adjacent green pixel unit, the green light emitted from the light emitting device 600G in the green pixel unit may be propagated to an adjacent red pixel unit and an adjacent blue pixel unit, and the blue light emitted from the light emitting device 600B in the blue pixel unit may be propagated to an adjacent green pixel unit. Such phenomenon may lead to unnecessary color mixing, so that a desired color displaying effect cannot be achieved by such display panel.

Figure 2:
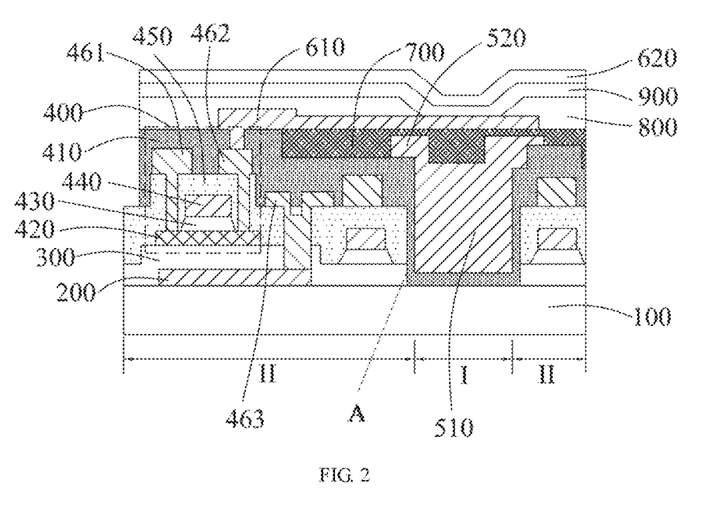
FIG. 2 is a cross-sectional view of a display panel according to an embodiment of the present disclosure.

FIG. 2 is a cross-sectional view of a display panel according to an embodiment of the present disclosure.

As shown in FIG. 2, the display panel includes a substrate 100 and a plurality of pixel units formed on the substrate 100, wherein each pixel unit includes, in a thickness direction of the display panel, a driving and light filtering structure and a light emitting element formed on a side of the driving and light filtering structure facing away from the substrate 100.

The driving and light filtering structure includes a driving part II and a light filtering part I. The driving part II is used for driving the light emitting element to emit light, and the light filtering part I is used for filtering colors of the light emitted by the light emitting element.

The light filtering part I is disposed in an accommodating hole A penetrating through insulating layers in the driving part II in the thickness direction of the display panel.

According to an embodiment of the present disclosure, the light filtering part I is a generic name of components having a light filtering function in the driving and light filtering structure, and all other components except the light filtering part I in the driving and light filtering structure constitute the driving part II.

According to an embodiment of the present disclosure, the insulating layers in the driving part II refers to layers formed of insulating materials for spacing conductive layers forming the driving part II from each other.

According to an embodiment of the present disclosure, the driving part II includes a TFT (e.g., the TFT 400), and the light filtering part I includes a color resisting block 510. In FIG. 2, the TFT 400 is illustrated as a top-gate type TFT, and the display panel according to the embodiment of the present disclosure will be described in detail below by taking the top-gate type TFT as an example, however, the present disclosure is not intended to limit the type of the TFT 400, and the TFT 400 may be other types of TFTs, for example, a bottom-gate type TFT.

By providing the accommodating hole A in the insulating layers and disposing the light filtering part I in the accommodating hole A, the light filtering part I can be disposed on the substrate 100 side by side with the driving part II rather than above the driving part II, and therefore, the height difference between the surface of the light filtering part I facing the light emitting element and the surface of the driving part II facing the light emitting element is small. When the light emitting element is formed on the driving and light filtering structure, a flat surface on which a first electrode 600 of the light emitting element is disposed can be obtained only by disposing a planarization layer 700 having a small thickness, and even without disposing the planarization layer 700. In other words, in the display panel according to the present disclosure, the distance between the light emitting element and the driving and light filtering structure is small (even zero).

Because the thickness of the planarization layer 700 is small (even no planarization layer 700 is provided), light leakage from the light emitting element of each pixel unit and color mixing between adjacent pixel units are reduced. How the planarization layer 700 having a small thickness reduces light leakage from the light emitting element of each pixel unit and color mixing between different pixel units will be described blow by taking a structure shown in FIG. 3 as an example.

Figure 3:
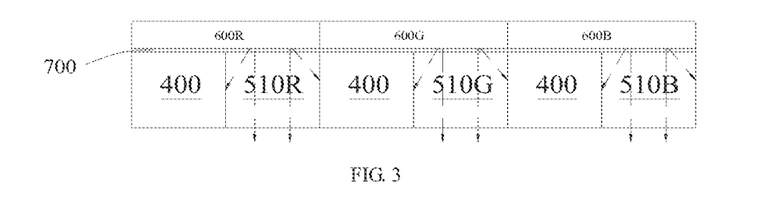
FIG. 3 is a schematic view of light emission of a light emitting element in a display panel according to an embodiment of the present disclosure.

FIG. 3 is a schematic view of light emission of a light emitting element in a display panel according to an embodiment of the present disclosure. As shown in FIG. 3, the light emitting element is a bottom emission type light emitting element, i.e., the light emitting element emits light toward the driving and light filtering structure. A red pixel unit, a green pixel unit, and a blue pixel unit shown in FIG. 3 are disposed side by side. The red pixel unit includes a light emitting element 600R for emitting red light, the green pixel unit includes a light emitting element 600G for emitting green light, and the blue pixel unit includes a light emitting element 600B for emitting blue light. The planarization layer 700 is formed between the driving and light filtering structure and the light emitting elements, and the planarization layer 700 is formed of a transparent organic material. Light emitted from the light emitting elements will propagate through the planarization layer 700, and thus, the planarization layer 700 may be regarded as a light leakage gap.

A portion of the light emitted from the light emitting element 600R may exit from the substrate (not shown) after passing through the planarization layer 700 and being irradiated on the red color resisting block 510R. Meanwhile, a portion of the light emitted from the light emitting element 600R which passes through the planarization layer 700 and then is irradiated on the TFTs 400 at two sides of the red color resisting block 510R will be blocked by a circuit structure (e.g., the TFT 400) of the driving and light filtering structure, so that the portion of the light emitted from the light emitting element 600R which passes through the planarization layer 700 and then is irradiated on the TFTs 400 at two sides of the red color resisting block 510R will not enter adjacent pixel units of the red pixel unit.

Similarly, a portion of the light emitted from the light emitting element 600G which is irradiated on the green color resisting block 510G may exit from the substrate, and a portion of the light which is irradiated on the TFTs 400 at two sides of the green color resisting block 510G will also be blocked by the circuit structure of the driving and light filtering structure, and therefore the portion of the light which is irradiated on the TFTs 400 at the two sides of the green color resisting block 510G will not enter adjacent pixel units of the green pixel unit. A portion of the light emitted from the light emitting element 600B which is irradiated on the blue color resisting block 510B may exit from the substrate, and a portion of the light which is irradiated on the TFTs 400 at two sides of the blue color resisting block 510B will also be blocked by the circuit structure of the driving and light filtering structure, and thus the portion of the light which is irradiated on the TFTs 400 at the two sides of the blue color resisting block 510B will not enter adjacent pixel units of the blue pixel unit.

In the display panel according to the embodiment of the present disclosure, since the transparent planarization layer 700 between the driving and light filtering structure and the light emitting elements has a small thickness (even no planarization layer 700 is provided), the light leakage gap of each light emitting element is small, thus only a very small amount of light is irradiated into the adjacent pixel units along the light leakage gap, and the light irradiated into the adjacent pixel units is blocked by the circuit structure of the driving and light filtering structure, so that the very small amount of light irradiated into the adjacent pixel units cannot affect emitting light color of the pixel unit, and thus color mixing between different pixel units can be greatly avoided.

In the display panel of the embodiment of the disclosure, two features of "blocking of the circuit structure in the driving and light filtering structure" and "a thinner planarization layer, even no planarization layer is provided" are provided, so that color mixing between different pixel units can be greatly avoided, and the display panel can achieve a better display effect.

In addition to avoiding color mixing between different pixel units having different colors, power consumption of the display panel according to the embodiment of the present disclosure is also lower.

In the display panel according to the embodiment of the present disclosure, since the planarization layer has a small thickness, a transparency of the planarization layer is higher. When the light emitting element is a bottom emission type light emitting element and light emitted by the light emitting element reaches the light filtering part, a loss of the light caused by the planarization layer is small, so that a light emitting rate of each pixel unit can be improved, a brightness of the display panel can be improved, and the power consumption of the display panel can be reduced. When the planarization layer is not provided, the light emitted by the light emitting element is directly irradiated on the color resisting block, and a loss of luminance is much smaller.

In addition, the planarization layer having a small thickness (even no planarization layer is provided) can reduce a total thickness of the display panel, and realize lightening and thinning of the display panel.

According to an embodiment of the present disclosure, the light emitting element may be an organic light emitting diode, and may also be a quantum dot light emitting diode. Referring back to FIG. 2, the light emitting element includes a first electrode 610, a light emitting functional layer 900, and a second electrode 620. When the light emitting element in the display panel is a bottom emission type light emitting element, the first electrode 610 may be an anode of the light emitting element, the second electrode 620 may be a cathode of the light emitting element, and the first electrode 610 may be formed of a transparent electrode material.

When the TFT 400 is a top-gate type TFT, the insulating layers in the driving part II may include an interlayer insulating layer 450.

According to an embodiment of the present disclosure, the TFT 400 includes an active layer 420, a gate insulating layer 430, a gate electrode 440, and a source-drain layer sequentially disposed in a direction away from the substrate 100. The gate 440 and the source-drain layer are respectively disposed on two sides of the interlayer insulating layer 450. The source-drain layer includes a source electrode 461 and a drain electrode 462, the source electrode 461 is connected to the active layer 420 through a source via hole penetrating through the interlayer insulating layer 450, and the drain electrode 462 is connected to the active layer 420 through a drain via hole penetrating through the interlayer insulating layer 450. The accommodating hole A penetrates through the interlayer insulating layer 450 in the thickness direction of the interlayer insulating layer 450.

The active layer 420 may be formed of indium gallium zinc oxide (IGZO), the gate insulating layer 430 may be formed of an oxide of silicon, and the gate electrode 440, the source electrode 461, and the drain electrode 462 may be formed of copper.

According to an embodiment of the present disclosure, the gate insulating layer 430 is shaped to conform to the gate electrode 440, so that the thickness of the display panel may be reduced.

The TFT 400 in each pixel unit forms a driving part II for driving the light emitting element to emit light. In the present disclosure, the number of the TFT 400 in the driving part II is not limited, and although only one TFT 400 is illustrated in FIG. 2, this does not mean that only one TFT is included in one driving part II.

According to an embodiment of the present disclosure, in order to avoid an influence of ambient light on the active layer 420 of the TFT 400, the driving part II may further include a light shielding layer 200. The light shielding layer 200 is formed of an opaque material and located on a side of the active layer 420 facing the substrate 100, and an orthographic projection of the active layer 420 of the TFT 400 on the substrate 100 is located within an orthographic projection of the light shielding layer 200 on the substrate 100. The light shielding layer 200 may block ambient light, which is beneficial to the active layer 420 for prolonging service life.

The specific material of the light shielding layer 200 according to the embodiment of the present disclosure is not particularly limited. For example, the light shielding layer 200 may be formed of a metal material, and in such embodiment, the display panel may further include a buffer layer 300. As shown in FIG. 2, the light shielding layer 200 is directly formed on a surface of the substrate 100 facing the active layer 420, and the buffer layer 300 is located between the light shielding layer 200 and the active layer 400. The buffer layer 300 may be formed of an insulating transparent inorganic material, for example, silicon oxide or silicon nitride.

When the light shielding layer 200 is formed of a metal material, in order to prevent static electricity from being generated on the light shielding layer 200 and a "pseudo dual gate" structure from being formed in the TFT 400, the light shielding layer 200 and an electrostatic discharge line 463 may be electrically connected. The static electricity discharging line 463 and the source-drain layer may be disposed on a same layer, and the electrostatic discharge line 463 is electrically connected to the light shielding layer 200 through a via hole penetrating through the buffer layer 300 and the interlayer insulating layer 450. The "pseudo dual gate" structure may cause the TFT 400 to fail to be turned on according to a set gate driving voltage, thereby further causing display errors.

According to an embodiment of the present disclosure, the light shielding layer 200 may be formed of metal molybdenum or molybdenum niobium alloy, and a thickness of the light shielding layer 200 may be between 0.1 and 0.15 μm. The buffer layer 300 may be formed of silicon oxide, and a thickness of the buffer layer 300 may be between 0.3 and 0.5 μm. In the present embodiment, the accommodating hole A also penetrates through the buffer layer 300 to reduce the height difference between the light filtering part I and the driving part II.

The TFT 400 may further include a passivation layer 410 covering the source-drain layer, and the source electrode 461 and the drain electrode 462 may be protected by the passivation layer 410. The passivation layer 410 extends into the accommodating hole A, and the color resisting block 510 is disposed on the passivation layer 410.

The passivation layer 410 is used for protecting and passivating surfaces of the source electrode 461 and drain electrode 462 and data lines (not shown) disposed at a same layer as the source electrode 461 and the drain electrode 462, and thus, the passivation layer 410 only needs to have a small thickness. Since the thickness of the passivation layer 410 is small, the entire thickness of the light filtering I is not greatly affected even if a portion of the passivation layer 410 locating in the accommodating hole A is not removed. According to the embodiments of the present disclosure, after the passivation layer 410 is formed, a complicated patterning process is no need to be performed on the passivation layer 410, thereby simplifying a manufacturing method of the display panel.

When manufacturing the display panel, the interlayer insulating layer 450 having the accommodating hole A is formed first, and then the passivation layer 410 is formed, so that the material of the passivation layer 410 is formed not only on the bottom of the accommodating hole A, but also on the sidewall of the accommodating hole A.

According to an embodiment of the present disclosure, in order to further ensure that the first electrode 600 of the light emitting element to be formed on a flat surface, the display panel further includes the planarization layer 700 located between the driving and light filtering structure and the light emitting element, and a surface of the planarization layer 700 facing away from the driving and light filtering structure is a flat surface. In the present disclosure, since the light filtering part I and the driving part II are disposed side by side, and the height difference between the top surfaces of the light filtering part I and the driving part I is small, a relatively flat surface can be obtained only by forming the planarization layer 700 having a small thickness. Since the planarization layer 700 has a small thickness, the planarization layer 700 has a high transmittance, so that the luminance of the display panel can be improved, and thus the power consumption of the display panel can be reduced.

As described hereinbefore, the light emitting element may be a bottom emission type organic light emitting diode. The light emitting element includes the first electrode 610, the light emitting functional layer 900 and the second electrode 620. The first electrode 610 is formed of a transparent conductive material and disposed on a surface of the driving and light filtering structure facing away from the substrate 100.

The surface of the driving and light filtering structure facing away from the substrate 100 may be a surface of the planarization layer 700. In FIG. 2, the planarization layer 700 is not required to be disposed on the surface of the driving part II, but only be disposed on the surface of the light filtering part I, so that the surface of the driving and light filtering structure facing away from the substrate 100 is formed as a relatively flat surface, and the overall thickness of the display panel can be reduced. However, the present disclosure is not limited to providing the planarization layer 700 only on the surface of the light filtering part I such that an upper surface of the planarization layer 700 and an upper surface of a portion of the passivation layer 410 are coplanar, and in a case where an upper surface of the passivation layer 410 in the driving part II is not flat, the planarization layer 700 may be provided on the entire passivation layer 410, in such case, the first electrode 610 is connected to the drain electrode 462 of the TFT via a via hole penetrating through the planarization layer 700 and the passivation layer 410.

According to an embodiment of the present disclosure, in order to further avoid color mixing between different pixel units, the light filtering part I may further include a light shielding flange 520 formed on a surface of the color resisting block 510 facing away from the substrate 100. The light shielding flange 520 is disposed around the accommodating hole A and connected to the color resisting block 510 in the accommodating hole A. The material of the light shielding flange 520 is same as the material of the color resisting block 510 connected to the light shielding flange 520. The color resisting block 510 allows light having the same color as the color resisting block 510 to pass therethrough, and absorbs light having different colors from the color resisting block 510. Likewise, the light shielding flange 520 may allow light having the same color as the light shielding flange 520 to pass therethrough and absorb light having different colors from the light shielding flange 520. When light emitted from the light emitting elements in pixel units adjacent to the pixel unit where the color resisting block 510 is disposed propagates to the light shielding flange 520 through the planarization layer 700, the light can be absorbed by the light shielding flange 520, thereby further preventing the color mixing from occurring.

The display panel further includes a pixel defining layer 800 covering the first electrode 610, and a plurality of pixel openings are formed in the pixel defining layer 800. The plurality of pixel openings correspond to a plurality of color resisting blocks, respectively, at least a portion of the light emitting functional layer 900 is disposed in the pixel openings. An area of a pixel opening is smaller than a cross-sectional area of a corresponding color resisting block 510, that is, an orthographic projection of the pixel opening on the substrate 100 is located within an orthographic projection of the color resisting block 510 on the substrate 100. Setting the pixel opening to have an area smaller than the cross-sectional area of the corresponding color resisting block 510 can further prevent light leakage and color mixing.

According to an embodiment of the present disclosure, an interval between an edge of the orthographic projection of the pixel opening on the substrate 100 and an edge of the orthographic projection of the color resisting block 510 on the substrate 100 may be between 2 and 3 µm.

According to an embodiment of the present disclosure, the driving and light filtering structure further includes gate lines and data lines, and the pixel units may be divided by interleaving the gate lines and the data lines with each other.

Figure 4:
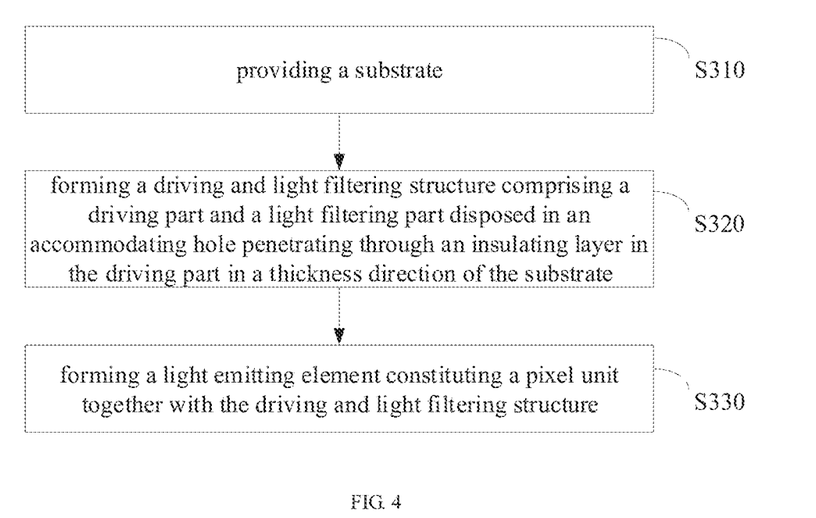
FIG. 4 is a flowchart of a manufacturing method of a display panel according to an embodiment of the present disclosure.

FIG. 4 is a flowchart of a manufacturing method of a display panel according to an embodiment of the present disclosure.

As shown in FIG. 4, the manufacturing method includes steps S310 to S330.

In step S310, a substrate is provided.

In step S320, a driving and light filtering structure including a driving part and a light filtering part disposed in an accommodating hole penetrating through an insulating layer in the driving part in a thickness direction of the substrate is formed.

In step S330, a light emitting element is formed, and the light emitting element and the driving and light filtering structure are formed as a pixel unit.

The manufacturing method according to the embodiment of the present disclosure is used to manufacture the above mentioned display panel. As described above, in the driving and light filtering structure, a height difference in a surface of the driving and light filtering structure facing away from the substrate is small, and therefore, only a planarization layer having a small thickness needs to be provided, even the planarization layer does not need to be provided, thus a surface with good flatness can be obtained.

The light emitting element is a bottom emission type light emitting element, and color mixing and light leakage among different pixel units are less during displaying. Further, light emitted by the light emitting element loses less when the light reaches the color resisting block, so that a brightness of the display panel can be improved, and power consumption of the display panel can be reduced. In addition, a thickness of the display panel can be reduced by disposing the planarization layer having a small thickness or not disposing the planarization layer, and thus the display panel is thinned.

The manufacturing method according to the embodiment of the present disclosure may manufacture the above mentioned display panel, and as described above, the driving and light filtering structure includes a plurality of top-gate type TFTs, and the insulating layer includes an interlayer insulating layer of a TFT, in such case, the step S320 includes: forming an active layer; forming a gate insulating layer; forming a gate electrode; forming an interlayer insulating material layer; patterning the interlayer insulating material layer to form an interlayer insulating layer having an accommodating hole, a source via hole and a drain via hole; forming a source-drain layer including a source electrode and a drain electrode, wherein the source electrode is connected with the active layer through the source via hole, and the drain electrode is connected with the active layer through the drain via hole; and forming a light filtering part in the accommodating hole.

The manufacturing method according to the embodiment of the present disclosure may further include, between the steps of forming the source-drain layer and forming the light filtering part, forming a passivation layer covering the source-drain layer.

In the step of forming the passivation layer, the passivation layer extends into the accommodating hole. In order to simplify manufacturing processes, the passivation layer may not be patterned so that the subsequently formed light filtering part is formed on the passivation layer.

In the present disclosure, how to form the light filtering part is not particularly limited. In general, the light filtering part is formed of a photosensitive resin, and in this case, the step of forming the light filtering part may include: forming a color resist material layer; exposing and developing the color resist material layer to form a color resisting block positioned in the accommodating hole and a light shielding flange positioned outside and surrounding the accommodating hole and connected with the color resisting block, and the light shielding flange is formed on a side of the color resisting block facing away from the substrate. In a same driving and light filtering structure, the color resisting block and the light shielding flange are formed as a light filtering part.

According to an embodiment of the present disclosure, a specific material of the interlayer insulating layer is not particularly limited, and for example, the interlayer insulating layer may be formed of silicon oxide and/or silicon nitride.

In order to ensure the first electrode to be formed on a flat surface, the manufacturing method further includes, between the steps of forming the passivation layer and forming the light emitting element, forming a planarization layer, wherein a surface of the planarization layer facing away from the passivation layer is a flat surface. The planarization layer has a small thickness and a high transmittance.

According to an embodiment of the present disclosure, the manufacturing method further includes, between the steps of providing the substrate and forming the active layer, forming a light shielding layer, wherein an orthographic projection of the light shielding layer on the substrate covers an orthographic projection of the active layer on the substrate.

According to an embodiment of the present disclosure, the manufacturing method further includes, between the steps of forming the light shielding layer and forming the active layer, forming a buffer layer on the substrate and the light shielding layer, such that the accommodating hole penetrates through the buffer layer.

As described above, the light shielding layer may prevent ambient light from irradiating the active layer of the TFT to protect the active layer of the TFT.

The light shielding layer may be formed of metal molybdenum or molybdenum niobium alloy, and in this case, the manufacturing method may further include, between the steps of forming the light shielding layer and forming the active layer, forming a buffer layer. According to the embodiment of the present disclosure, the buffer layer may be formed of silicon oxide. In a process of forming the display panel having the buffer layer, the accommodating hole further penetrates through the buffer layer.

According to an embodiment of the present disclosure, the step of forming the light emitting element includes: forming a first electrode with a transparent conductive material; forming a pixel defining layer including a pixel opening, wherein an area of the pixel opening is smaller than a cross-sectional area of the color resisting block, that is, an orthographic projection of the pixel opening on the substrate is located within an orthographic projection of the color resisting block on the substrate; forming a light emitting functional layer, wherein at least a portion of the light emitting functional is located in the pixel opening; and forming a second electrode.

The appearance of light leakage and color mixing can be further prevented by setting the pixel opening to have an area smaller than that of the color resisting block.

According to an embodiment of the present disclosure, an interval between an edge of the orthogonal projection of the pixel opening on the substrate and an edge of the orthogonal projection of the color resisting block on the substrate may be between 2 and 3 µm.

According to an embodiment of the present disclosure, the driving and light filtering structure further includes gate lines and data lines, and pixel units may be divided by interleaving the gate lines and the data lines with each other.

A manufacturing method of the display panel shown in FIG. 2 is described in detail below with reference to FIGS. 5 to 9.

FIGS. 5 to 9 illustrate cross-sectional views of the manufacturing method of the display panel according to an embodiment of the present disclosure.

Figure 5:
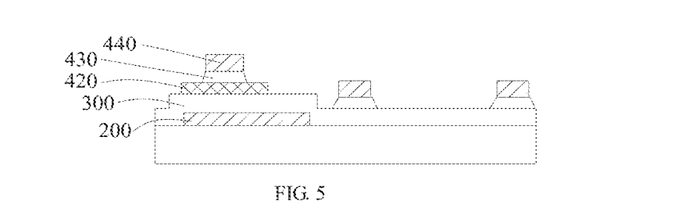
FIGS. 5 to 9 illustrate cross-sectional views of a manufacturing method of a display panel according to an embodiment of the present disclosure.

As shown in FIG. 5, a shielding metal material layer is deposited on a substrate (which may be a glass substrate), and the shielding metal material layer may be formed of a metal such as molybdenum or a molybdenum niobium alloy, and has a thickness of 0.10 to 0.15 µm. A photoresist material layer is formed, and the photoresist material layer is exposed and developed to form a photoresist pattern of a light shading layer. Wet-etching is performed on the shielding metal material layer having the photoresist pattern of the light shielding layer by using mixed acid to form a light shielding layer 200. A buffer layer 300 is deposited, typically, the buffer layer 300 may be formed of silicon oxide, and a thickness of the buffer layer 300 is 0.3 to 0.5 µm. An indium gallium zinc oxide (IGZO) layer with a thickness of 0.05 to 0.1 µm is deposited. The IGZO layer is patterned to form an active layer 420. A gate insulating material layer is deposited, and the gate insulating material layer is formed of silicon oxide and has a thickness of 0.1 to 0.2 μm. A gate metal layer is deposited, and the gate metal layer may be formed of copper and other metals and has a thickness of 0.4 to 0.5 μm. Then a gate mask pattern is formed, and a pattern including a gate 440 and a gate line is formed by wet-etching. For example, the wet-etching is performed on the copper metal layer by using $H_2O_2$, and after the pattern including the gate 400 and the gate line is formed by the wet-etching, the gate mask pattern is reserved to perform dry-etching on the gate insulating material layer to form a gate insulating layer 430. For example, the dry-etching process may be performed by using a mixed gas of high carbon tetrafluoride ($CF_4$) and low oxygen ($O_2$), wherein a flow rate of the $CF_4$ may be 2000 to 2500 sccm, and a flow rate of the $O_2$ may be 1000 to 1500 sccm. A portion of the active layer 420 not covered by the gate insulating layer 430 is conductorized by using ammonia gas or helium gas.

Figure 6:
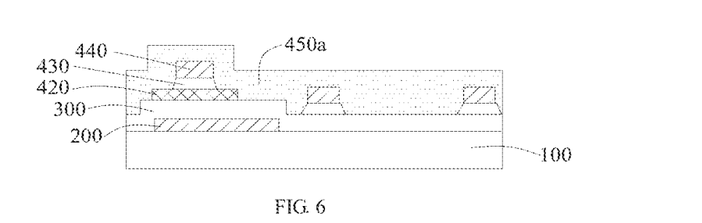
Figure 7:
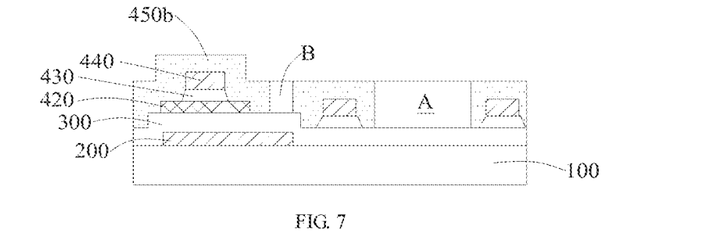

As shown in FIG. 6, an interlayer insulating material layer 450*a* is deposited, and the interlayer insulating material layer 450*a* may be formed of silicon oxide and has a thickness of 0.4 to 0.6 μm. Because of a large thickness, the interlayer insulating material layer 450*a* and the buffer layer 300 may be etched twice. A mask pattern including an initial electrostatic discharge via hole and an initial accommodating hole may be formed on the interlayer insulating material layer 450*a*, then, most of the material of the interlayer insulating material layer 450*a* may be wet-etched. Typically, hydrofluoric acid (HF) may be used for etching, and after the wet-etching, the mask pattern may be stripped, that is, the shape shown in FIG. 7 may be formed. An electrostatic discharge via hole B and an accommodating hole A penetrating through the interlayer insulating material layer 450*b* may be formed.

Figure 8:
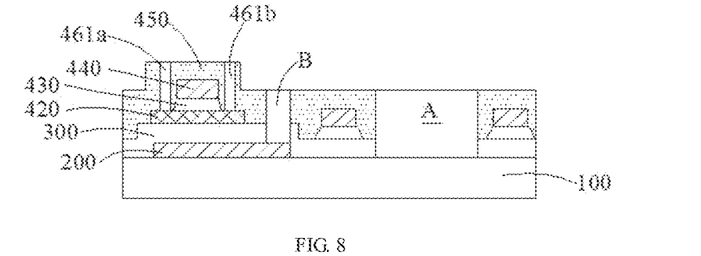

As shown in FIG. 8, a mask pattern corresponding to a source via hole and a drain via hole is formed. The interlayer insulating material layer 450*b* is further etched to form a source via hole 461*a* and a drain via hole 461*b*, the electrostatic discharge via hole B is further etched to penetrate through the buffer layer 300, and the accommodating hole A is further etched to penetrate through the buffer layer 300. Typically, carbon tetrafluoride and oxygen ($CF_4+O_2$) are used for etching, a gas flow rate of the $CF_4$ is 1000 to 1500 sccm, and a gas flow rate of the $O_2$ is 1200 to 800 sccm. Wet-stripping is performed after the electrostatic discharge via hole B and the accommodating hole A are etched. Considering an opening ratio and the disposing of a light shielding flange, an edge of the accommodating hole A are 2 to 4 μm from edges of surrounding metal lines, and a depth of the accommodating hole A is about 2 μm.

Figure 9:
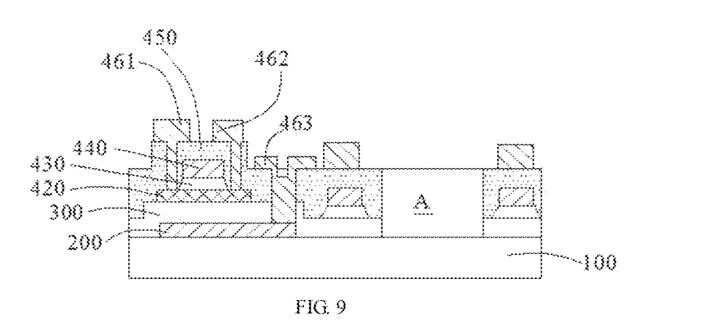

As shown in FIG. 9, a layer of source-drain metal is deposited, the metal may be copper, aluminum, etc., and a thickness of the layer is 0.5 to 0.7 μm. The metal is wet-etched to form a pattern including a source-drain layer, specifically including a source electrode 461, a drain electrode 462, a data line and an electrostatic discharge line 463, and it should be noted that no source-drain metal is deposited in the accommodating hole A.

Referring back to FIG. 2, a passivation layer 410 is deposited, wherein the passivation layer 410 may be formed of silicon oxide and has a thickness of 0.3 to 0.5 μm. A color filtering process is performed, a color resisting block is formed on the passivation layer 410 in the accommodating hole A and a light shielding flange is formed outside the accommodating hole A, wherein a thickness of the color resisting block can be 1.5 to 2.2 μm for matching the depth of the accommodating hole A and considering photoresistance color gauge. A planarization layer 700 is formed, a first electrode via hole penetrating through the passivation layer 410 is formed, a layer of indium tin oxide (ITO) having a thickness of 700 to 1200 angstroms is deposited, a first electrode photoresist pattern is formed, and wet-etching is performed on the layer of ITO to form a pattern including a first electrode 610. Typically, the layer of ITO can be etched by using oxalic acid or mixed acid, and annealing is performed on the layer of ITO after the layer of ITO is etched and wet-stripped. A pixel defining layer 800 is formed after the annealing process is finished, and a pixel opening is formed in the pixel defining layer 800 at a position corresponding to the color resisting block in the accommodating hole A. In order to prevent light leakage and color mixing, an orthographic projection of the pixel opening on the substrate is located in an orthographic projection of the accommodating hole A on the substrate, and an interval between edges of the orthographic projections of the pixel opening and the accommodating hole A on the substrate is 2 to 3 μm. A light emitting functional layer 900 is formed by evaporation, and a second electrode 620 is formed.

The display panel having the structure shown in FIG. 2 can be obtained by the above steps.

Embodiments of the present disclosure also provide a display device, which includes the above display panel provided by the present disclosure.

In the present disclosure, there is no particular limitation on a specific application scenario of the display device, and for example, the display device may be any one of electronic devices such as a television, a mobile phone, a tablet computer, a navigator, a computer display, and the like.

It is to be understood that the above embodiments are merely exemplary embodiments that are employed to illustrate the principles of the present disclosure, and the present disclosure is not limited thereto. It will be apparent to those skilled in the art that various changes and modifications can be made therein without departing from the spirit and scope of the disclosure, and these are to be considered as the scope of the disclosure.

The invention claimed is:

1. A display panel comprising a substrate and a pixel unit formed on the substrate, wherein
    along a thickness direction of the display panel, the pixel unit comprises a driving and light filtering structure and a light emitting element formed at a side of the driving and light filtering structure facing away from the substrate, and
    wherein the driving and light filtering structure comprises a driving part and a light filtering part, the driving part comprises a thin film transistor (TFT), and the light filtering part comprises a color resisting block, the color resisting block is disposed in an accommodating hole penetrating through an interlayer insulating layer included in the light filtering part along the thickness direction, and the interlayer insulating layer included in the light filtering part and an interlayer insulating layer included in the TFT are the same layer, and
    wherein the color resisting block is closer to the substrate than the TFT.

2. The display panel according to claim 1, wherein the TFT further comprises an active layer, a gate insulating layer, a gate electrode, and a source-drain layer sequentially disposed in a direction away from the substrate, and
    wherein the gate electrode and the source-drain layer are respectively disposed on two sides of the interlayer insulating layer, the source-drain layer comprises a source electrode and a drain electrode, the source electrode is connected with the active layer through a source via hole penetrating through the interlayer insulating layer, the drain electrode is connected with the active layer through a drain via hole penetrating through the interlayer insulating layer, and the accommodating hole penetrates through the interlayer insulating layer along the thickness direction.

3. The display panel according to claim 2, wherein the driving part further comprises a light shielding layer provided between the active layer and the substrate, and an orthographic projection of the active layer on the substrate is located within an orthographic projection of the light shielding layer on the substrate.

4. The display panel according to claim 3, wherein the driving part further comprises a buffer layer provided on a side of the substrate facing the active layer, a part of the buffer layer is provided between the substrate and the light shielding layer, and the accommodating hole penetrates through the buffer layer.

5. The display panel according to claim 2, wherein the driving part further comprises an electrostatic discharge line disposed on a same layer as the source-drain layer.

6. The display panel according to claim 2, wherein the TFT further comprises a passivation layer covering the source-drain layer, the passivation layer extends into the accommodating hole, and the color resisting block is disposed on the passivation layer.

7. The display panel according to claim 1, wherein the light filtering part further comprises a light shielding flange formed on a side of the color resisting block facing away from the substrate, the light shielding flange is disposed around the accommodating hole and connected to the color resisting block in the accommodating hole, and a material of the light shielding flange is same as a material of the color resisting block connected to the light shielding flange.

8. The display panel according to claim 1, wherein the light emitting element comprises a first electrode comprising a transparent conductive material, a light emitting functional layer, and a second electrode, and the first electrode is disposed on the side of the driving and light filtering structure facing away from the substrate.

9. The display panel according to claim 8, wherein the display panel further comprises a planarization layer between the driving and light filtering structure and the light emitting element, a surface of the planarization layer facing away from the driving and light filtering structure is a flat surface, and the first electrode is disposed on the surface of the planarization layer facing away from the driving and light filtering structure.

10. The display panel according to claim 8, wherein the display panel further comprises a pixel defining layer covering the first electrode, a pixel opening is formed in the pixel defining layer, at least a part of the light emitting functional layer is disposed in the pixel opening, and an orthographic projection of the pixel opening on the substrate is located within an orthographic projection of the color resisting block on the substrate.

11. A display device comprising the display panel according to claim 1.

12. A manufacturing method of a display panel, comprising:
providing a substrate;
forming a driving and light filtering structure comprising a driving part and a light filtering part, the driving part comprises a thin film transistor (TFT), and the light filtering part comprises a color resisting block, the color resisting block being disposed in an accommodating hole penetrating through an interlayer insulating layer included in the light filtering part in a thickness direction of the substrate, the interlayer insulating layer included in the light filtering part and an interlayer insulating layer included in the TFT are the same layer, and the color resisting block is closer to the substrate than the TFT; and
forming a light emitting element constituting a pixel unit together with the driving and light filtering structure.

13. The manufacturing method according to claim 12, wherein the forming the driving and light filtering structure comprises:
forming an active layer;
forming a gate insulating layer;
forming a gate electrode;
forming an interlayer insulating material layer;
patterning the interlayer insulating material layer to form an interlayer insulating layer having the accommodating hole, a source via hole and a drain via hole;
forming a source-drain layer comprising a source electrode and a drain electrode, wherein the source electrode is connected with the active layer through the source via hole, and the drain electrode is connected with the active layer through the drain via hole; and
forming the color resisting block in the accommodating hole.

14. The manufacturing method according to claim 13, wherein the forming the driving and light filtering structure further comprises, between the forming the source-drain layer and the forming the light filtering part:
forming a passivation layer covering the source-drain layer,
wherein the passivation layer extends into the accommodating hole, and the color resisting block is formed on the passivation layer.

15. The manufacturing method according to claim 13, wherein the forming the color resisting block comprises:
forming a color resist material layer; and
exposing and developing the color resist material layer to form a color resisting block positioned in the accommodating hole and a light shielding flange positioned outside and surrounding the accommodating hole and connected with the color resisting block, wherein the light shielding flange is formed on a side of the color resisting block facing away from the substrate.

16. The manufacturing method according to claim 13, further comprising, between the providing the substrate and the forming the active layer:
forming a light shielding layer,
wherein an orthographic projection of the active layer on the substrate is located within an orthographic projection of the light shielding layer on the substrate.

17. The manufacturing method according to claim 16, further comprising, between the forming the light shielding layer and the forming the active layer:
forming a buffer layer on the substrate and the light shielding layer,
wherein the accommodating hole penetrates through the buffer layer.

18. The manufacturing method according to claim 15, wherein the forming the light emitting element comprises:
forming a first electrode with a transparent conductive material;
forming a pixel defining layer comprising a pixel opening, wherein an orthographic projection of the pixel opening on the substrate is located within an orthographic projection of the color resisting block on the substrate;

forming a light emitting functional layer, wherein at least a portion of the light emitting functional layer is located in the pixel opening; and forming a second electrode.

19. The manufacturing method according to claim 18, further comprising, between the forming the driving and light filtering structure and the forming the light emitting element:

forming a planarization layer, wherein a surface of the planarization layer facing away from the driving and light filtering structure is a flat surface, and the first electrode of the light emitting element is formed on the surface of the planarization layer facing away from the driving and light filtering structure.

* * * * *